(12) United States Patent
Fu et al.

(10) Patent No.: US 8,586,927 B2
(45) Date of Patent: Nov. 19, 2013

(54) SWITCH MODULE, ELECTRONIC DEVICE USING THE SAME AND METHOD FOR MANUFACTURING THE SAME

(75) Inventors: Ze-Sen Fu, Shenzhen (CN); Ren-Wei Tseng, Miao-Li County (TW)

(73) Assignees: Innocom Technology (Shenzhen) Co., Ltd., Shenzhen, Guangdong Province (CN); Chimei InnoLux Corporation, Miaoli County (TW)

( * ) Notice: Subject to any disclaimer, the term of this patent is extended or adjusted under 35 U.S.C. 154(b) by 240 days.

(21) Appl. No.: 13/221,923

(22) Filed: Aug. 31, 2011

(65) Prior Publication Data

US 2012/0056089 A1    Mar. 8, 2012

(30) Foreign Application Priority Data

Sep. 8, 2010    (CN) .......................... 2010 1 0275200

(51) Int. Cl.
*G01J 5/00*    (2006.01)
(52) U.S. Cl.
USPC ...................................................... 250/338.1

(58) Field of Classification Search
USPC ............................... 250/338.1, 338.4, 339.01
See application file for complete search history.

(56) References Cited

U.S. PATENT DOCUMENTS

| | | | |
|---|---|---|---|
| 6,181,089 B1 | 1/2001 | Kovach et al. | |
| 2009/0184852 A1* | 7/2009 | Ahn et al. | 341/31 |
| 2011/0220648 A1* | 9/2011 | Yang et al. | 220/211 |

* cited by examiner

*Primary Examiner* — Mark R Gaworecki
(74) *Attorney, Agent, or Firm* — Li & Cai Intellectual Property (USA) Office

(57) ABSTRACT

A switch module, an electronic device using the same and a method for manufacturing the same are provided. The switch module includes a circuit board, an infrared (IR) light receiver, at least one light emitting unit and a cover. The IR light receiver is disposed on the circuit board for receiving an infrared light. The light emitting unit is disposed on the circuit board for emitting a visible light. The cover includes a first casing and a second casing, and covers the IR light receiver. The first casing shields the IR light receiver. The second casing is connected to the second casing. The transparency of the second casing is larger than that of the first casing. The second casing receives the visible light and then the visible light is emitted to the outside of the second casing.

20 Claims, 7 Drawing Sheets

SWITCH MODULE, ELECTRONIC DEVICE USING THE SAME AND METHOD FOR MANUFACTURING THE SAME

This application claims the benefit of China application Serial No. 2010102755200.X, filed Sep. 8, 2010, the subject matter of which is incorporated herein by reference.

BACKGROUND

1. Technical Field

The disclosure relates in general to a switch module, an electronic device using the same and a method for manufacturing the same, and more particularly to a switch module, an electronic device using the same and a method for manufacturing the same with both infrared light reception function and indicator function.

2. Description of Related Art

With the advance in technology, various electronic devices are constantly provided. In order to achieve some particular functions, many electronic devices have the design of disposing some of the elements on the outer casing.

In the pursuit of the trend of lightweight, slimness, compactness and aesthetics, the designers are dedicated to integrating the elements which are disposed on the outer casing of an electronic device. However, such integration is not easy because different elements have different attributes. For example, photo transmission is a must for some elements but opaque is required by other elements. After a long period of tests and trials, some designers have developed such a thought that some elements cannot be integrated.

SUMMARY OF THE DISCLOSURE

The disclosure is directed to a switch module, an electronic device using the same and a method for manufacturing the same, in which many elements are integrated through structural design.

According to a first aspect of the present disclosure, a switch module is provided. The switch module includes a circuit board, an infrared (IR) light receiver, at least one light emitting unit and a cover. The IR light receiver is disposed on the circuit board for receiving an infrared light. The light emitting unit is disposed on the circuit board for emitting a visible light. The cover includes a first casing and a second casing, and covers the IR light receiver. The first casing shields the IR light receiver. The second casing is connected to the second casing. The transparency of the second casing is larger than that of the first casing. The second casing receives the visible light and then the visible light is emitted to the outside of the second casing.

According to a second aspect of the present disclosure, an electronic device is provided. The electronic device includes an outer casing and a switch module. The outer casing has an opening. The switch module is disposed inside the outer casing, and includes a circuit board, an IR light receiver, at least one light emitting unit and a cover. The IR light receiver is disposed on the circuit board for receiving an infrared light. The light emitting unit is disposed on the circuit board for emitting a visible light. The cover includes a first casing and a second casing, and covers the IR light receiver. The first casing shields the IR light receiver. The second casing is connected to the first casing. The transparency of the second casing is larger than that of the first casing. The opening exposes a portion of the first casing and the second casing. The second casing receives the visible light and then the visible light is emitted to the outside of the opening.

According to a third aspect of the present disclosure, a method for manufacturing switch module is provided. The method for manufacturing switch module includes the following steps: An IR light receiver and a light emitting unit are disposed on a circuit board. The IR light receiver is for receiving an infrared light. A cover is formed from two different materials by way of a double injection process. The IR light receiver is covered by the cover, wherein the cover is disposed in the path of a visible light emitted by the light emitting unit.

The above and other aspects of the disclosure will become better understood with regard to the following detailed description of the preferred but non-limiting embodiment(s). The following description is made with reference to the accompanying drawings.

DETAILED DESCRIPTION OF THE DISCLOSURE

Figure 1:
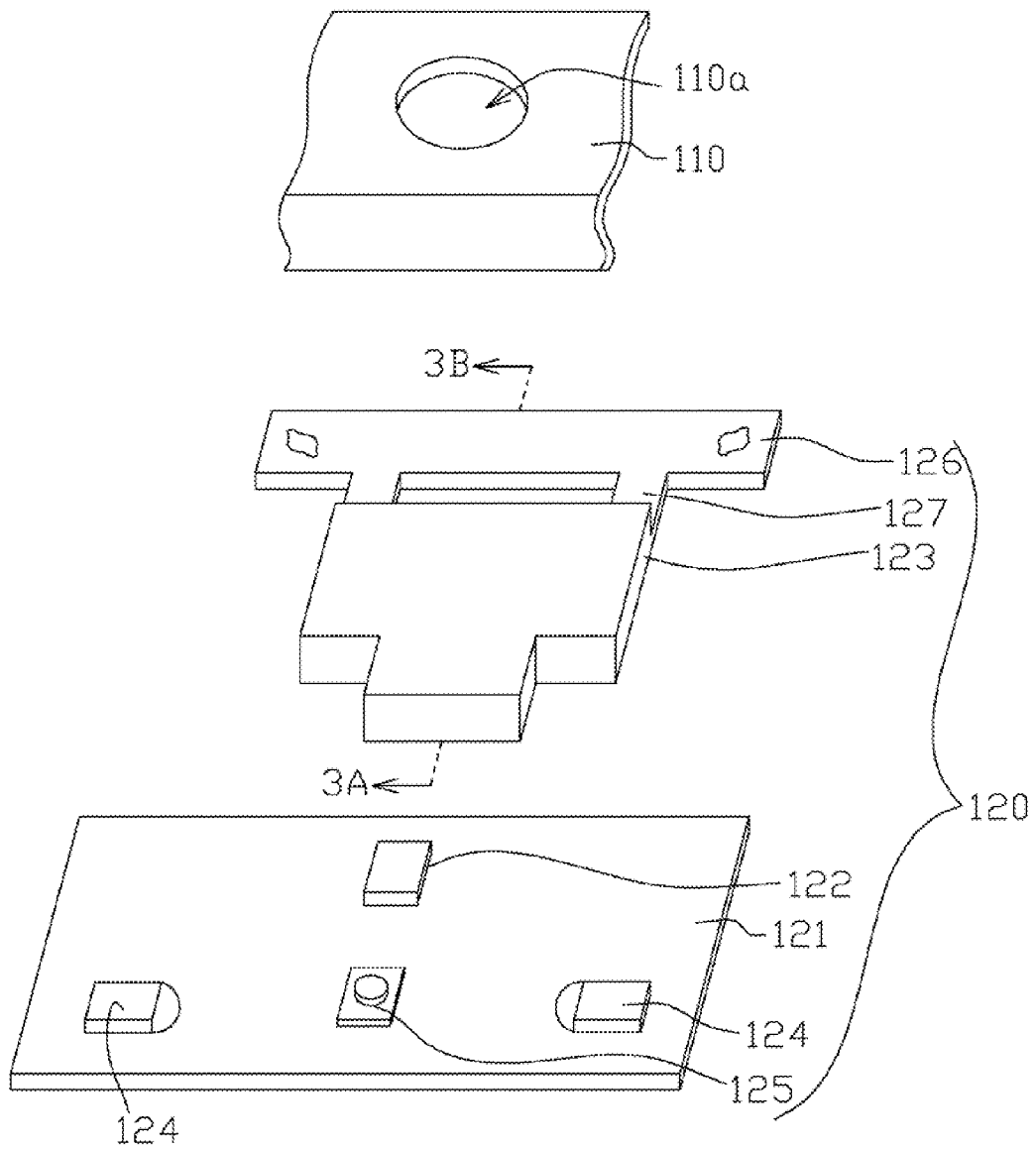
FIG. 1 shows a decomposition diagram of an electronic device according to a first embodiment of the disclosure.
Figure 2:
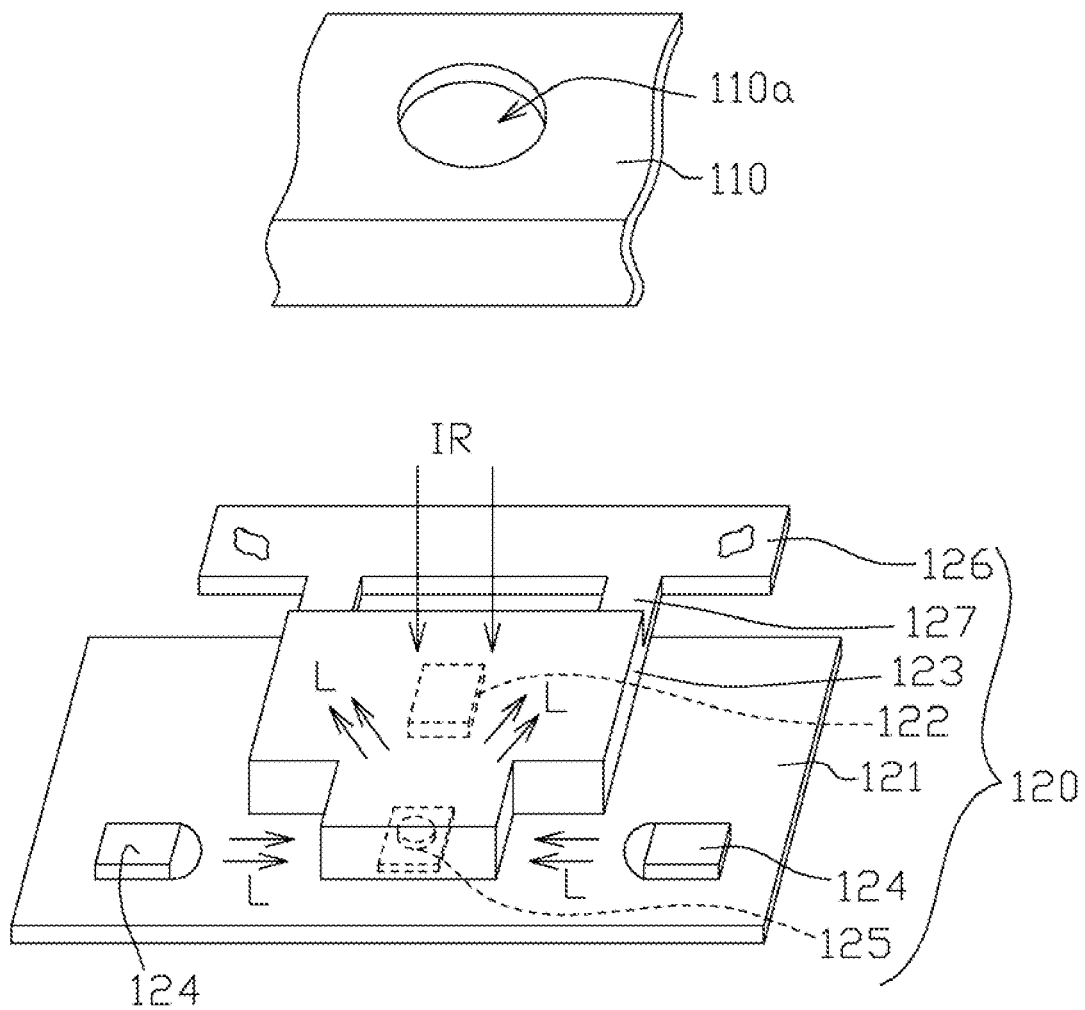
FIG. 2 shows an assembly diagram of a portion of the elements of FIG. 1.

Referring to both FIG. 1 and FIG. 2. FIG. 1 shows a decomposition diagram of an electronic device 100 according to a first embodiment of the disclosure. FIG. 2 shows an assembly diagram of a portion of the elements of FIG. 1. The electronic device 100 includes an outer casing 110 and a switch module 120. In the present embodiment of the disclosure, the electronic device 100 is realized by such as a computer, a display screen or a TV. The switch module 120 is disposed inside the outer casing 110. The outer casing 110 has an opening 110a, which exposes a portion of the switch module 120. The switch module 120 includes a circuit board 121, an IR light receiver 122, a cover 123, at least one light emitting unit 124 and a button 125. As indicated in FIG. 2, the IR light receiver 122, the light emitting unit 124 and the button 125 are all disposed on the circuit board 121. The cover 123 covers the IR light receiver 122 and the button 125.

As indicated in FIG. 2, the IR light receiver 122 is used for receiving an infrared light IR. The received infrared light IR is decoded into various control instructions. The light emitting unit 124, such as a light emitting diode, is for emitting a visible light L. The button 125, when being pressed, emits a touch signal.

Figure 3:
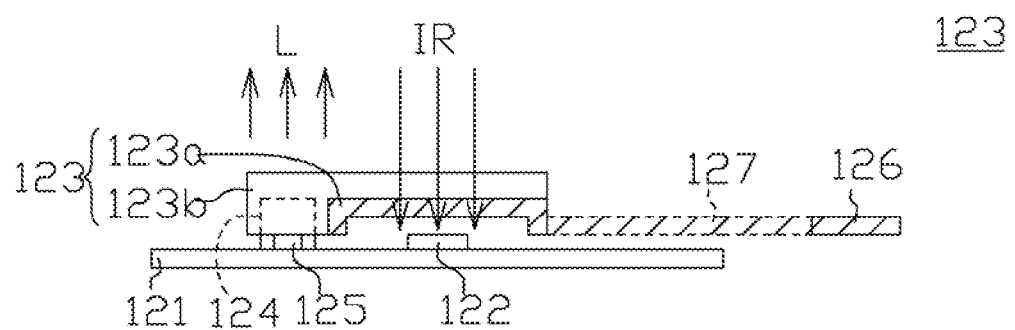
FIG. 3 shows a cross-section of the cover of FIG. 1 viewed along a cross-sectional line 3A-3B.

Referring to FIG. 3, a cross-section of the cover 123 of FIG. 1 viewed along a cross-sectional line 3A-3B is shown. To further illustrate the relationship between the cover 123 and the IR light receiver 122, the light emitting unit 124 and the button 125, a cross-sectional diagram of the IR light receiver 122, the light emitting unit 124 and the button 125 is illustrated in FIG. 3. The present embodiment of the disclosure implements the infrared light receiving function through the incorporation of the IR light receiver 122 and the cover 123. Besides, the present embodiment of the disclosure implements the button function through the incorporation of the button 125 and the cover 123. Moreover, the present embodiment of the disclosure implements indicator function through the design of the light emitting unit 124 and the cover 123.

The cover 123 includes a first casing 123a and a second casing 123b. The first casing 123a shields the IR light receiver 122, and the second casing 123b is connected to and covers the first casing 123a. In another embodiment, the second casing 123b may merely be connected to the first casing 123a but does not cover the first casing 123a. The second casing 123b and the first casing 123a are formed by different materials but are integrally formed in one piece from two different materials by way of a double injection process. The transparency of the second casing 123b is larger than that of the first casing 123a. The transparency of the first casing 123a is low that of the elements (such as the IR light receiver 122) covered by the first casing 123a is invisible to the naked eyes.

The transparency of the second casing 123b is so high that the visible light L can be refracted inside the second casing 123b. The materials of first casing 123a include an infrared light transmissible material with low transparency (the infrared light transmissible material is formed inside the first casing 123a, so the infrared light transmissible material is not illustrated in the diagram). The infrared light IR can pass through the infrared light transmissible material, but the visible light cannot pass through the infrared light transmissible material, so the first casing 123a has low transparency but the infrared light IR still can pass through the first casing 123a. The materials of the second casing 123b include a diffusive material with high transparency and a filling material (the diffusive material and the filling material are both formed inside the second casing 123b, so the diffusive material and the filling material are both not illustrated in the diagram). The visible light L can pass through the filling material and can be diffused by the diffusive material. Thus, after the visible light L emitted by the light emitting unit 124 is received by the second casing 123b, the visible light L is diffused or reflected to the outside.

Referring to FIG. 2. In terms of the relationship between the cover 123 and the IR light receiver 122, the cover 123 shields the IR light receiver 122. The infrared light IR passes through both the second casing 123b (illustrated in FIG. 3) and the first casing 123a (illustrated in FIG. 3) of the cover 123, and then reaches the IR light receiver 122.

Referring to FIG. 2. In terms of the relationship between the cover 123 and the light emitting unit 124, the light emitting unit 124 is located outside the cover 123. After the visible light L emitted by the light emitting unit 124 enters the cover 123, the visible light L is refracted or reflected by the second casing 123b (illustrated in FIG. 3) of the cover 123 and then is emitted to the outside via the opening 110a of the outer casing 110.

Figure 4:
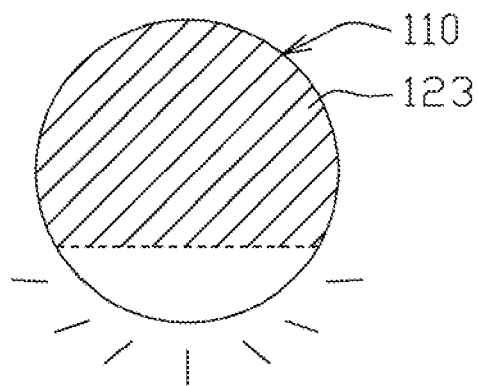
FIG. 4 shows the cover viewed from an opening.

Referring to FIG. 4, the cover 123 viewed from the opening 110a is shown. When viewed from the opening 110a, the upper half of the cover 123 is occupied by the first casing 123a (illustrated in FIG. 3) with low transparency, and the lower half of the cover 123 is occupied by the second casing 123b (illustrated in FIG. 3) with high transparency. After the visible light L enters the second casing 123b (illustrated in FIG. 3), the visible light L is diffused by the diffusion material, so the user can see the lower half of the cover 123 emitting the light.

Referring to FIG. 1 and FIG. 2. In terms of the relationship between the cover 123 and the button 125, a portion of the cover 123 can movably lean against the button 125. In the present embodiment of the disclosure, the cover 123 further includes a bracket 126 and a flexible arm 127, wherein the bracket 126 is fixed on the outer casing 110, and the flexible arm 127 is connected to the bracket 126 and the cover 123. A portion of the cover 123 is swung through the flexible arm 127 with respect to the button 125. Thus, the user can trigger the button 125 by pressing the cover 123.

Thus, through the design of the first casing 123a and the second casing 123b of the cover 123, the switch module 120 can implement infrared light reception function, the button function and indicator function.

Figure 5:
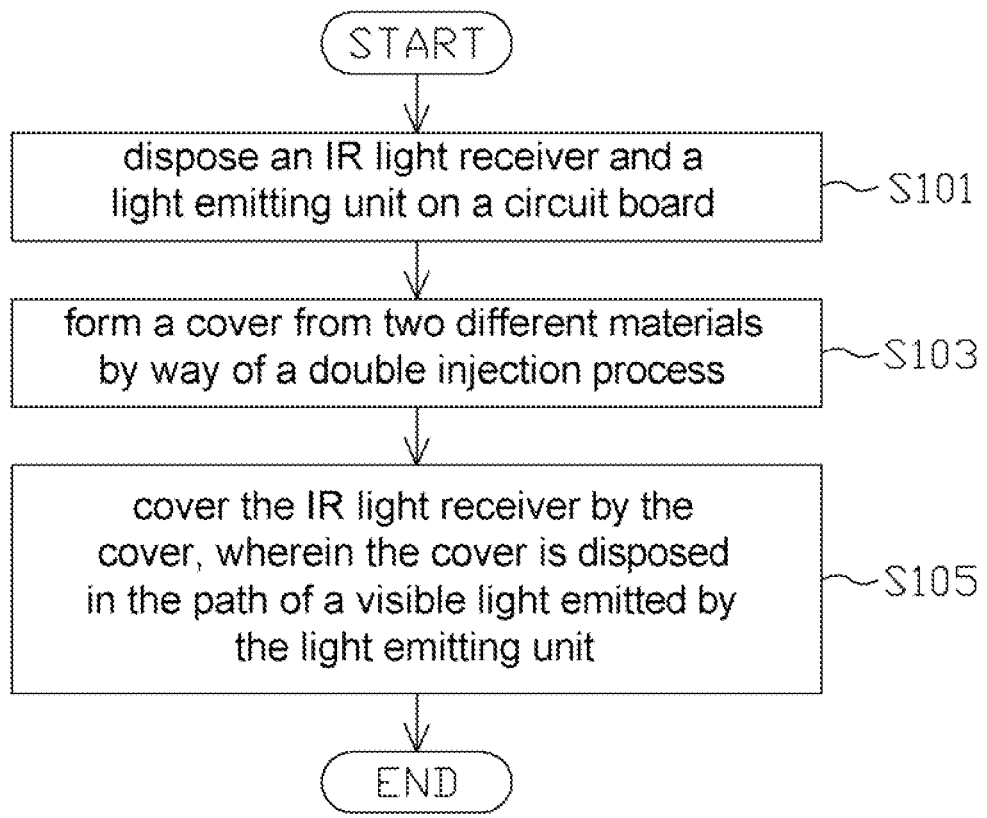
FIG. 5 shows a flowchart of a method for manufacturing a switch module according to the present embodiment of the disclosure.

Referring to FIG. 5, a flowchart of a method for manufacturing a switch module 120 according to the present embodiment of the disclosure is shown. Firstly, referring to FIG. 1. In step S101, the IR light receiver 122, the light emitting unit 124 and the button 125 are disposed on the circuit board 121.

Then, referring to FIG. 3. In step S103, the first casing 123a and the second casing 123b of the cover 123 are formed from two different materials by way of a double injection process. As disclosed above, the transparency of the first material of the first casing 123a is lower than that of the second material of the second casing 123b. The first material includes an infrared light transmissible material with low transparency. The second material includes a diffusive material and an filling material with high transparency.

Then, referring to FIG. 2. In step S105, the IR light receiver 122 is covered by a cover 123, which is disposed in the path of the visible light L emitted by the light emitting unit 124. In the present embodiment of the disclosure, the light emitting unit 124 is disposed outside the cover 123, and the light outgoing surface of the light emitting unit 124 faces the cover 123. Thus, the switch module 120 of the present embodiment of the disclosure is completed.

Figure 6:
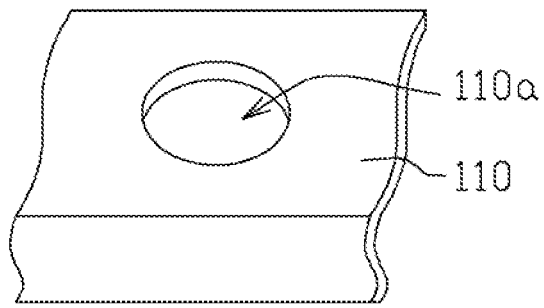
FIG. 6 shows a decomposition diagram of an electronic device according to a second embodiment of the disclosure.
Figure 6:
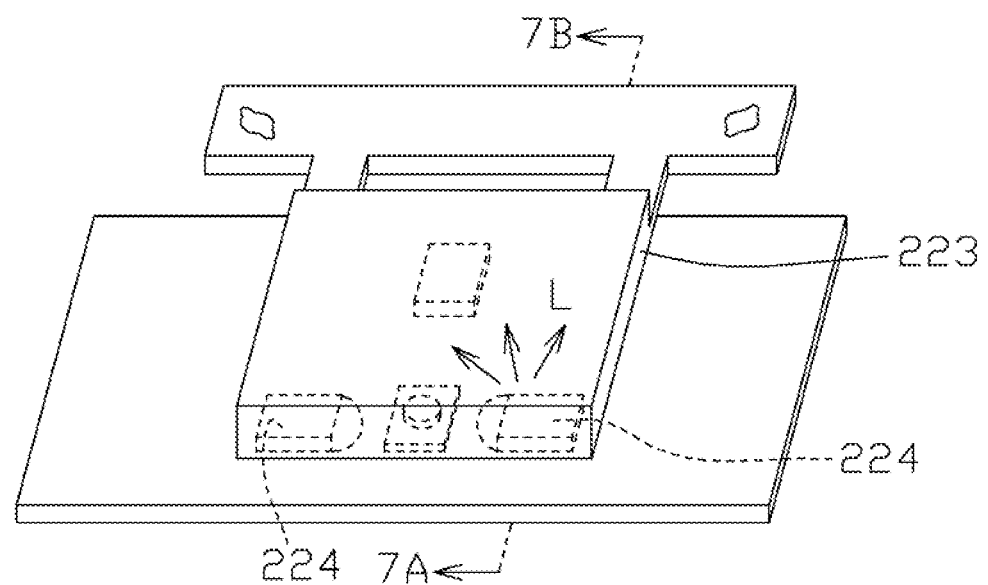

Referring to FIG. 6, a decomposition diagram of an electronic device 200 according to a second embodiment of the disclosure is shown. The present electronic device 200 of the embodiment of the disclosure is different from the electronic device 100 of the first embodiment in the position of the light emitting unit 224, and the similarities are not repeated here.

Figure 7:
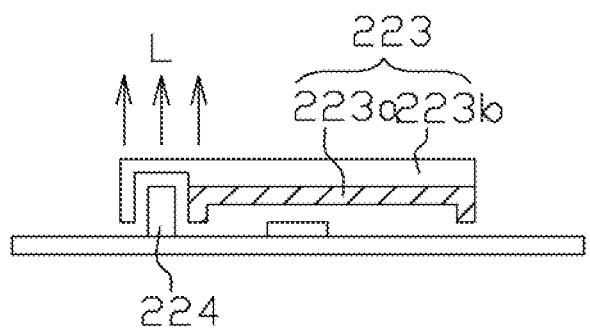
FIG. 7 shows a cross-section of the cover of FIG. 6 viewed along a cross-sectional line 7A-7B

Referring to FIGS. 6 and 7. FIG. 7 a cross-section of the cover 223 of FIG. 6 viewed along a cross-sectional line 7A-7B. The cover 223 of the present embodiment of the disclosure is composed of the first casing 223a and the second casing 223b formed with different by way of a double injection process. The second casing 223b covers the light emitting unit 224, and the visible light L emitted by the light emitting unit 224 can directly reach the second casing 223b. After the visible light L is diffused by the diffusive material, the second casing 223b illuminates and can be viewed from outside.

While the disclosure has been described by way of example and in terms of the preferred embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A switch module, comprising:
   a circuit board;
   an IR light receiver disposed on the circuit board for receiving an infrared light;
   at least one light emitting unit disposed on the circuit board for emitting a visible light; and
   a cover for covering the IR light receiver, wherein the cover comprises:
   a first casing for shielding the IR light receiver; and
   a second casing connected to the first casing, wherein the transparency of the second casing is larger than that of the first casing, and the second casing receives the visible light and then the visible light is emitted to the outside of the second casing.

2. The switch module according to claim 1, wherein the first casing and the second casing are integrally formed in one piece.

3. The switch module according to claim 1, wherein the light emitting unit is disposed outside the second casing.

4. The switch module according to claim 1, wherein the cover covers the light emitting unit.

5. The switch module according to claim 1, further comprising a button disposed on the circuit board, wherein a portion of the cover movably leans against the button.

6. The switch module according to claim 5, wherein the switch module is disposed inside an electronic device, the electronic device comprises an outer casing, and the cover further comprises:
   a bracket fixed on the outer casing; and
   a flexible arm connected to the bracket and the cover, wherein a portion of the cover swings with respect to the button through the flexible arm.

7. The switch module according to claim 1, wherein the materials of the first casing comprise an infrared light transmissible material for passing through the infrared light.

8. The switch module according to claim 1, wherein the materials of the second casing comprise a diffusive material for diffusing the visible light.

9. An electronic device, comprising:
   an outer casing having an opening; and
   a switch module disposed inside the outer casing, wherein the switch module comprises:
      a circuit board;
      an IR light receiver disposed on the circuit board for receiving an infrared light;
      at least one light emitting unit disposed on the circuit board for emitting a visible light; and
      a cover for covering the IR light receiver, wherein the cover comprises:
         a first casing for shielding the IR light receiver; and
         a second casing connected to the first casing, wherein the transparency of the second casing is larger than that of the first casing, and the second casing receives the visible light and then the visible light is emitted to the outside of the opening,
      wherein the opening exposes a portion of the first casing and the second casing.

10. The electronic device according to claim 9, wherein the first casing and the second casing are integrally formed in one piece.

11. The electronic device according to claim 9, wherein the light emitting unit is disposed outside the second casing.

12. The electronic device according to claim 9, wherein the cover covers the light emitting unit.

13. The electronic device according to claim 9, wherein the switch module further comprises:
   a button disposed on the circuit board, wherein a portion of the cover movably leans against the button.

14. The electronic device according to claim 13, wherein the cover further comprises:
   a bracket fixed on the outer casing; and
   a flexible arm connected to the bracket and the cover, wherein a portion of the cover swings with respect to the button through the flexible arm.

15. The electronic device according to claim 9, wherein the materials of the first casing comprise an infrared light transmissible material for passing through the infrared light.

16. The electronic device according to claim 9, wherein the materials of the second casing comprise a diffusive material for diffusing the visible light.

17. A method for manufacturing a switch module, comprising:
   disposing an IR light receiver and a light emitting unit on a circuit board, wherein the IR light receiver is for receiving an infrared light;
   forming a cover from two different materials by way of a double injection process; and
   covering the IR light receiver by the cover, wherein the cover is disposed in the path of a visible light emitted by the light emitting unit.

18. The method for manufacturing the switch module according to claim 17, wherein the step of forming the cover comprises:
   forming a first casing of the cover with a first material; and
   forming a second casing of the cover with a second material, wherein the second casing is connected to the first casing and the transparency of the second material is larger than that of the first material.

19. The method for manufacturing the switch module according to claim 18, wherein the first material comprises an infrared light transmissible material for passing through the infrared light.

20. The method for manufacturing the switch module according to claim 18, wherein the second material comprises a diffusive material for diffusing the visible light.

* * * * *